(12) United States Patent
Yang

(10) Patent No.: US 10,734,605 B2
(45) Date of Patent: Aug. 4, 2020

(54) FLEXIBLE OLED DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Wuhan, Hubei (CN)

(72) Inventor: Lin Yang, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 121 days.

(21) Appl. No.: 16/095,628

(22) PCT Filed: Aug. 24, 2018

(86) PCT No.: PCT/CN2018/102243
§ 371 (c)(1),
(2) Date: Oct. 22, 2018

(87) PCT Pub. No.: WO2020/015052
PCT Pub. Date: Jan. 23, 2020

(65) Prior Publication Data
US 2020/0028116 A1     Jan. 23, 2020

(30) Foreign Application Priority Data
Jul. 19, 2018    (CN) .......................... 2018 1 0797698

(51) Int. Cl.
*H01L 33/00*     (2010.01)
*H01L 31/0203*     (2014.01)
(Continued)

(52) U.S. Cl.
CPC ........ *H01L 51/5253* (2013.01); *H01L 51/004* (2013.01); *H01L 51/0043* (2013.01);
(Continued)

(58) Field of Classification Search
CPC ............... H01L 51/5253; H01L 51/004; H01L 51/0043; H01L 51/0097; H01L 51/56
See application file for complete search history.

(56) References Cited

U.S. PATENT DOCUMENTS

2014/0106111 A1*   4/2014   Nam ..................... G03F 7/0755
                                                                 428/76
2014/0179040 A1*   6/2014   Ramadas ............... H05B 33/04
                                                                  438/27

(Continued)

FOREIGN PATENT DOCUMENTS

CN         103579503 A      2/2014
CN         103959501 A      7/2014

*Primary Examiner* — Alonzo Chambliss
(74) *Attorney, Agent, or Firm* — Muncy, Geissler, Olds & Lowe, P.C.

(57) ABSTRACT

A flexible organic light emitting diode (OLED) device and a manufacturing method thereof are provided. The manufacturing method includes forming a flexible base; forming a light emitting layer on the flexible base; evaporating a barrier material including a precursor polymer, a photoinitiator and a cross-linking agent on a surface of the light emitting layer; and irradiating a light beam on a surface of the barrier material during evaporating the barrier material, so as to form a barrier layer on a surface of the light emitting layer to block water and oxygen.

19 Claims, 2 Drawing Sheets

(51) Int. Cl.
*H01L 21/00* (2006.01)
*H01L 51/52* (2006.01)
*H01L 51/56* (2006.01)
*H01L 51/00* (2006.01)
*H01L 27/32* (2006.01)

(52) U.S. Cl.
CPC .......... *H01L 51/0097* (2013.01); *H01L 51/56* (2013.01); *H01L 27/3244* (2013.01); *H01L 2227/323* (2013.01); *H01L 2251/308* (2013.01); *H01L 2251/558* (2013.01)

(56) References Cited

U.S. PATENT DOCUMENTS

| | | | |
|---|---|---|---|
| 2014/0319497 A1 | 10/2014 | Cho et al. | |
| 2015/0179976 A1* | 6/2015 | Galand | C09D 11/30 257/40 |
| 2015/0329747 A1* | 11/2015 | Cho | C09J 11/02 257/40 |
| 2019/0382632 A1* | 12/2019 | Cho | C09J 123/20 |
| 2020/0109320 A1* | 4/2020 | Jiang | C08L 23/26 |

* cited by examiner

FLEXIBLE OLED DEVICE AND MANUFACTURING METHOD THEREOF

CROSS REFERENCE TO RELATED APPLICATIONS

This application is a U.S. National Phase application submitted under 35 U.S.C. § 371 of Patent Cooperation Treaty Application serial No. PCT/CN2018/102243, filed on Aug. 24, 2018, which claims the priority of China Patent Application serial No. 201810797698.2, filed on Jul. 19, 2018, the disclosures of which are incorporated herein by reference in their entirety.

FIELD OF INVENTION

The present invention relates to the field of display technologies, and more particularly to a flexible organic light emitting diode (OLED) device and a manufacturing method thereof.

BACKGROUND OF INVENTION

At present, organic light emitting diode (OLED) devices are widely used because of their low power consumption, high contrast ratio, wide viewing angles, light and thin flexibility. Main application fields of OLED display technology include mobile phones, TVs, micro display devices, VR devices, and vehicle display devices. OLED display technology will replace TFT-LCD products and become the next generation of mainstream display technology.

Most important performance indicators of OLED devices include luminous efficiency and service life of the devices. At present, improvement of the luminous efficiency of OLED devices mainly depends on development of new functional materials and optimization of device structures. However, the service life of the device depends on packaging of the device, in addition to development of materials and device structures. Since OLED devices are highly sensitive to water and oxygen gases, presence of water and oxygen are the main cause of reduced service life of the devices.

In order to extend the service life of the device, OLED devices are typically packaged using packaging technology. Currently, the most common packaging technology is forming an inorganic layer and an organic layer or the two alternating multilayer structure to block water and oxygen contact with OLED devices by using chemical vapor deposition (CVD), physical vapor deposition (PVD) or atomic layer deposition (ALD) methods. However, this packaging technology reduces production efficiency due to its long packaging time, and this packaging technology uses expensive equipment and higher material cost, which increases production costs.

Therefore, it is necessary to provide a flexible OLED device and a manufacturing method thereof to solve the problems existing in the prior art.

SUMMARY OF INVENTION

The present invention provides a flexible organic light emitting diode (OLED) device and a manufacturing method thereof, which can reduce production cost and improve production efficiency.

In order to solve the above-mentioned problems, the present invention further provides a manufacturing method of a flexible organic light emitting diode (OLED) device, including:

forming a flexible base;
forming a light emitting layer on the flexible base;
evaporating a barrier material on a surface of the light emitting layer, wherein the barrier material includes a precursor polymer, a photoinitiator, and a cross-linking agent; a material of the precursor polymer includes, but not limited to, vinyl chloride, propylene, and styrene; a material of the cross-linking agent includes, but not limited to, N,N'-methylene diacrylamide; and irradiating a light beam on a surface of the barrier material during evaporating the barrier material, so as to form a barrier layer on a surface of the light emitting layer, wherein the barrier layer is configured to block water and oxygen.

In the manufacturing method of the flexible OLED device of the present invention, a material of the photoinitiator includes, but not limited to, 2-hydroxy-4'-(2-hydroxyethoxy)-2-methylpropiophenone and 2-butanone acid.

In the manufacturing method of the flexible OLED device of the present invention, a ratio of an evaporation rate of the photoinitiator to an evaporation rate of the precursor polymer ranges from 1:8 to 1:25.

In the manufacturing method of the flexible OLED device of the present invention, a ratio of an evaporation rate of the cross-linking agent to an evaporation rate of the precursor polymer ranges from 1:10 to 1:50.

In the manufacturing method of the flexible OLED device of the present invention, the flexible base includes a flexible substrate and a driver layer disposed on the flexible substrate, wherein the driver layer includes a buffer layer, a switch array layer, and an indium tin oxide (ITO) layer.

The present invention further provides a manufacturing method of a flexible organic light emitting diode (OLED) device, including:

forming a flexible base;
forming a light emitting layer on the flexible base;
evaporating a barrier material on a surface of the light emitting layer, wherein the barrier material includes a precursor polymer, a photoinitiator, and a cross-linking agent; and irradiating a light beam on a surface of the barrier material during evaporating the barrier material, so as to form a barrier layer on a surface of the light emitting layer, wherein the barrier layer is configured to block water and oxygen.

In the manufacturing method of the flexible OLED device of the present invention, a material of the precursor polymer includes, but not limited to, vinyl chloride, propylene, and styrene.

In the manufacturing method of the flexible OLED device of the present invention, a material of the cross-linking agent includes, but not limited to, N,N'-methylene diacrylamide.

In the manufacturing method of the flexible OLED device of the present invention, a material of the photoinitiator includes, but not limited to, 2-hydroxy-4'-(2-hydroxyethoxy)-2-methylpropiophenone and 2-butanone acid.

In the manufacturing method of the flexible OLED device of the present invention, a ratio of an evaporation rate of the photoinitiator to an evaporation rate of the precursor polymer ranges from 1:8 to 1:25.

In the manufacturing method of the flexible OLED device of the present invention, a ratio of an evaporation rate of the cross-linking agent to an evaporation rate of the precursor polymer ranges from 1:10 to 1:50.

In the manufacturing method of the flexible OLED device of the present invention, the flexible base includes a flexible substrate and a driver layer disposed on the flexible substrate, wherein the driver layer includes a buffer layer, a switch array layer, and an indium tin oxide (ITO) layer.

The present invention provides a flexible organic light emitting diode (OLED) device, including:

a flexible base;

a light emitting layer disposed on the flexible base; and a barrier layer disposed on the light emitting layer, wherein the barrier layer is formed by evaporating a barrier material on a surface of the light emitting layer and irradiating a light beam on a surface of the barrier material during evaporating the barrier material; the barrier layer is configured to block water and oxygen; and wherein the barrier material includes a precursor polymer, a photoinitiator, and a cross-linking agent.

In the flexible OLED device of the present invention, a material of the precursor polymer includes, but not limited to, vinyl chloride, propylene, and styrene.

In the flexible OLED device of the present invention, a material of the cross-linking agent includes, but not limited to, N,N'-methylene diacrylamide.

In the flexible OLED device of the present invention, a material of the photoinitiator includes, but not limited to, 2-hydroxy-4'-(2-hydroxyethoxy)-2-methylpropiophenone and 2-butanone acid.

In the flexible OLED device of the present invention, a ratio of an evaporation rate of the photoinitiator to an evaporation rate of the precursor polymer ranges from 1:8 to 1:25.

In the flexible OLED device of the present invention, a ratio of an evaporation rate of the cross-linking agent to an evaporation rate of the precursor polymer ranges from 1:10 to 1:50.

In the flexible OLED device of the present invention, the flexible base includes a flexible substrate and a driver layer disposed on the flexible substrate, wherein the driver layer includes a buffer layer, a switch array layer, and an indium tin oxide (ITO) layer.

The flexible OLED device of the present invention and the manufacturing method thereof, by respectively evaporating a polymer precursor polymer, a cross-linking agent, and a photoinitiator onto a surface of a light emitting layer, and performing polymerization by a light-inducing method, thereby forming a barrier layer on the surface of the OLED device. In addition, it effectively blocks water and oxygen, and reduces production cost and improves production efficiency while improving service life.

DETAILED DESCRIPTION OF PREFERRED EMBODIMENTS

Figure 1:
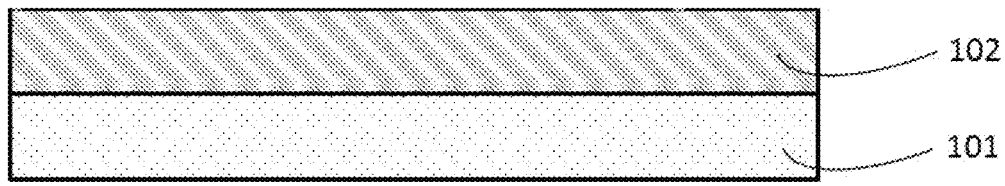
FIG. 1 is a schematic structural view of a first step of a manufacturing method of a flexible organic light emitting diode (OLED) device of the present invention.

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

Referring to FIG. 1 to FIG. 4, FIG. 1 is a schematic structural view of a first step of a manufacturing method of a flexible OLED device of the present invention.

The present invention provides a manufacturing method of a flexible OLED device, including the following steps:

S101, forming a flexible base;

As shown in FIG. 1, the flexible base may include a flexible substrate 101 and a driver layer 102, wherein the driver layer 102 may include a buffer layer, a switch array layer, an indium tin oxide (ITO) layer, and the like. Specifically, the buffer layer, the switch array layer, and the ITO layer are sequentially formed on the flexible substrate 101. Wherein the switch array layer includes a plurality of switching elements (TFT).

Figure 2:
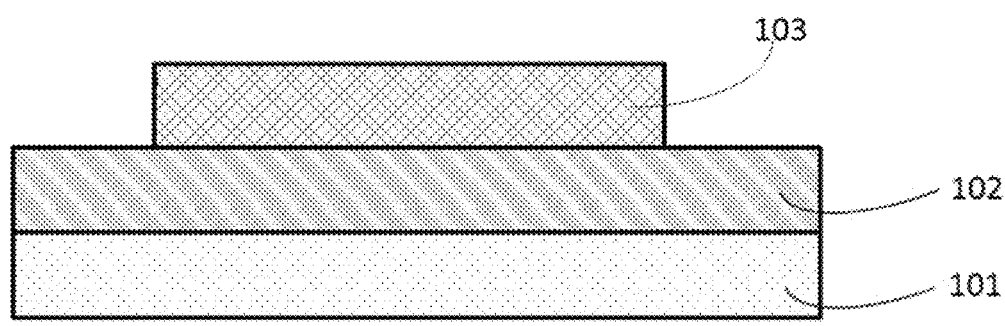
FIG. 2 is a schematic structural view of a second step of a manufacturing method of a flexible OLED device of the present invention.

S102, forming a light emitting layer on the flexible base;

As shown in FIG. 2, specifically, the luminescent material is evaporated on the surface of the driver layer 102, that is, the surface of the ITO, by using an evaporation equipment to obtain the light emitting layer 103. The light emitting layer 103 may include a plurality of light emitting units, such as a red light emitting unit, a green light emitting unit, and a blue light emitting unit. Wherein a thickness of the light emitting layer 103 is same as a thickness of the standard device.

Figure 3:
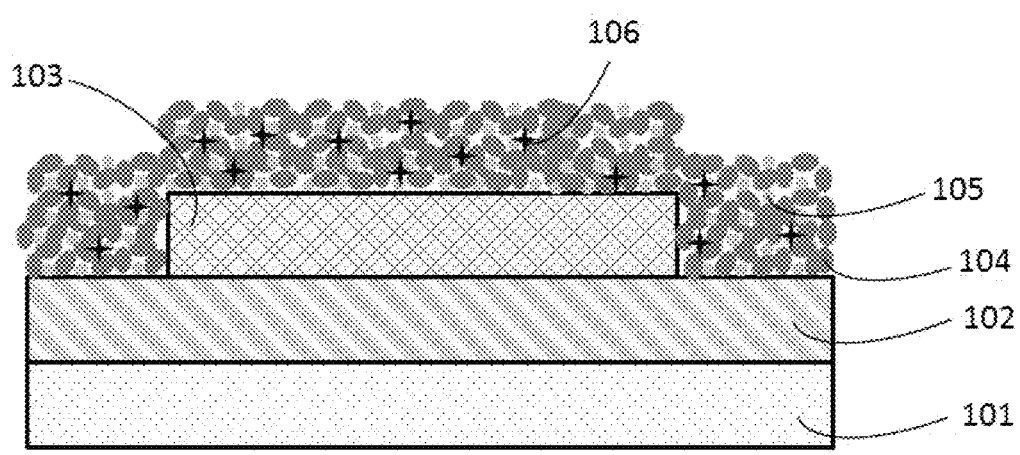
FIG. 3 is a schematic structural view of a third step of a manufacturing method of a flexible OLED device of the present invention.

S103, evaporating a barrier material on a surface of the light emitting layer;

As shown in FIG. 3, the barrier material includes a precursor polymer 104, a photoinitiator 105, and a cross-linking agent 106. For example, the precursor polymer 104 (dark gray ellipse in the figure), the photoinitiator 105 (light gray circle in the drawing), and the cross-linking agent 106 are simultaneously evaporated on the surface of above-mentioned the light emitting layer 103 by means of evaporation equipment.

Wherein, in order to improve the barrier effect of the barrier layer, thereby prolonging the service life of the OLED device, a material of the precursor polymer 104 includes, but not limited to, vinyl chloride, propylene, and styrene. a material of the photoinitiator 105 includes, but not limited to, 2-hydroxy-4'-(2-hydroxyethoxy)-2-methylpropiophenone (Irgacure 2959) and 2-butanone acid (2-KBA).

In order to further improve the barrier effect of the barrier layer, thereby further prolonging the service life of the OLED device, preferably, a ratio of an evaporation rate of the photoinitiator 105 to an evaporation rate of the precursor polymer ranges from 1:8 to 1:25.

A ratio of an evaporation rate of the cross-linking agent 106 to an evaporation rate of the precursor polymer 104 ranges from 1:10 to 1:50.

S104, irradiating a light beam on a surface of the barrier material during evaporating the barrier material, so as to form a barrier layer on a surface of the light emitting layer.

During the evaporation process of the precursor polymer 104, the photoinitiator 105, and the cross-linking agent 106, the surface of the barrier material (i.e., the evaporation surface) is subjected to the light beam irradiation, wherein the light beam may include visible light and ultraviolet light.

Figure 4:
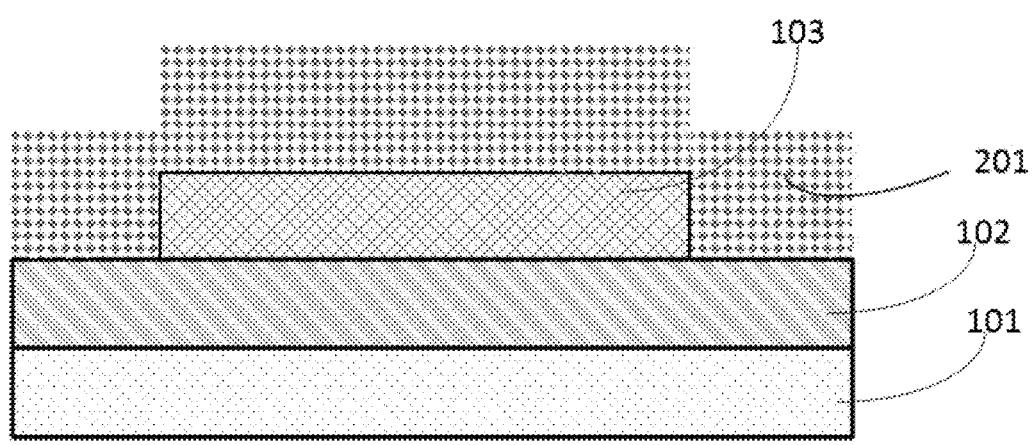
FIG. 4 is a schematic structural view of a fourth step of a manufacturing method of a flexible OLED device of the present invention.

As shown in FIG. 4, after the irradiation, the precursor polymer 104, the photoinitiator 105, and the cross-linking agent 106 are polymerized, thereby a barrier layer 201 can be formed on the surface of the light emitting layer 103, and the barrier layer 201 is used to block water and oxygen.

It will be appreciated that thermal treatment can be carried on the substrate to release the stress, thereby a fabrication of the OLED device is completed.

For example, the substrate is annealed at 50 to 80° C. for 2 to 10 minutes and then cooled at room temperature.

As shown in FIG. 4, the present invention further a flexible OLED device, the flexible OLED device includes a flexible base 101, 102, a light emitting layer 103, and a barrier layer 201.

The flexible base may include a flexible substrate 101 and a driver layer 102, wherein the driver layer 102 may include a buffer layer, a switch array layer (TFT layer), an ITO layer, and the like. The flexible base is specifically formed by sequentially forming the buffer layer, the switch array layer, and the ITO layer on the flexible substrate 101. The switch array layer includes a plurality of switching elements (TFT).

The light emitting layer 103 is disposed on the flexible base 101, 102, and the light emitting layer may include a plurality of light emitting units, such as a red light emitting unit, a green light emitting unit, and a blue light emitting unit. In conjunction with FIG. 2, specifically, the light emitting layer 103 is evaporated on a surface of the driver layer 102, i.e., a surface of the ITO, using an evaporation equipment. Wherein a thickness of the light emitting layer 103 is same as a thickness of the standard device.

The barrier layer 201 is disposed on the light emitting layer 103, wherein the barrier layer 201 is formed by evaporating a barrier material on the surface of the light emitting layer 103, and irradiating a surface of the barrier material with a light beam during the evaporation process.

In conjunction with FIG. 3, in which the barrier material includes a precursor polymer 104, a photoinitiator 105, and a cross-linking agent 106.

Wherein, a material of the precursor polymer 104 includes, but not limited to, vinyl chloride, propylene, and styrene. A material of the photoinitiator 105 includes, but not limited to, 2-hydroxy-4'-(2-hydroxyethoxy)-2-methylpropiophenone (Irgacure 2959) and 2-butanone acid (2-KBA). A material of the cross-linking agent includes, but not limited to, N,N'-methylene diacrylamide.

In order to further improve the barrier effect of the barrier layer, thereby further prolonging the service life of the OLED device, preferably, a ratio of an evaporation rate of the photoinitiator 105 to an evaporation rate of the precursor polymer ranges from 1:8 to 1:25.

A ratio of an evaporation rate of the cross-linking agent 106 to an evaporation rate of the precursor polymer 104 ranges from 1:10 to 1:50.

Specifically, during the evaporation process of the precursor polymer 104, the photoinitiator 105, and the cross-linking agent 106, the surface of the barrier material (i.e., the evaporation surface) is subjected to the light beam irradiation, wherein the light beam may include visible light and ultraviolet light. After irradiation, the precursor polymer 104, the photoinitiator 105, and the cross-linking agent 106 are polymerized, thereby a barrier layer 201 can be formed on the surface of the light emitting layer 103, and the barrier layer 201 is used to block water and oxygen.

The flexible OLED device of the present invention and the manufacturing method thereof, by respectively evaporating a polymer precursor polymer, a cross-linking agent, and a photoinitiator onto a surface of a light emitting layer, and performing polymerization by a light-inducing method, thereby forming a barrier layer on the surface of the OLED device. In addition, it effectively blocks water and oxygen, and reduces production cost and improves production efficiency while improving service life.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A manufacturing method of a flexible organic light emitting diode (OLED) device, comprising:
    forming a flexible base;
    forming a light emitting layer on the flexible base;
    evaporating a barrier material on a surface of the light emitting layer, wherein the barrier material comprises a precursor polymer, a photoinitiator, and a cross-linking agent; a material of the precursor polymer comprises vinyl chloride, propylene, and styrene; a material of the cross-linking agent comprises N,N'-methylene diacrylamide; and
    irradiating a light beam on a surface of the barrier material during evaporation of the barrier material, so as to form a barrier layer on a surface of the light emitting layer, wherein the barrier layer is configured to block water and oxygen.

2. The manufacturing method of the flexible OLED device according to claim 1, wherein a material of the photoinitiator comprises 2-hydroxy-4'-(2-hydroxyethoxy)-2-methylpropiophenone and 2-butanone acid.

3. The manufacturing method of the flexible OLED device according to claim 1, wherein a ratio of an evaporation rate of the photoinitiator to an evaporation rate of the precursor polymer ranges from 1:8 to 1:25.

4. The manufacturing method of the flexible OLED device according to claim 1, wherein a ratio of an evaporation rate of the cross-linking agent to an evaporation rate of the precursor polymer ranges from 1:10 to 1:50.

5. The manufacturing method of the flexible OLED device according to claim 1, wherein the flexible base comprises a flexible substrate and a driver layer disposed on the flexible substrate, wherein the driver layer comprises a buffer layer, a switch array layer, and an indium tin oxide (ITO) layer.

6. A manufacturing method of a flexible organic light emitting diode (OLED) device, comprising:
    forming a flexible base;
    forming a light emitting layer on the flexible base;
    evaporating a barrier material on a surface of the light emitting layer, wherein the barrier material comprises a precursor polymer, a photoinitiator, and a cross-linking agent; and
    irradiating a light beam on a surface of the barrier material during evaporating the barrier material, so as to form a barrier layer on a surface of the light emitting layer, wherein the barrier layer is configured to block water and oxygen.

7. The manufacturing method of the flexible OLED device according to claim 6, wherein a material of the precursor polymer comprises vinyl chloride, propylene, and styrene.

8. The manufacturing method of the flexible OLED device according to claim 6, wherein a material of the cross-linking agent comprises N,N'-methylene diacrylamide.

9. The manufacturing method of the flexible OLED device according to claim 6, wherein a material of the photoinitiator comprises 2-hydroxy-4'-(2-hydroxyethoxy)-2-methylpropiophenone and 2-butanone acid.

10. The manufacturing method of the flexible OLED device according to claim 6, wherein a ratio of an evaporation rate of the photoinitiator to an evaporation rate of the precursor polymer ranges from 1:8 to 1:25.

11. The manufacturing method of the flexible OLED device according to claim 6, wherein a ratio of an evaporation rate of the cross-linking agent to an evaporation rate of the precursor polymer ranges from 1:10 to 1:50.

12. The manufacturing method of the flexible OLED device according to claim 6, wherein the flexible base comprises a flexible substrate and a driver layer disposed on the flexible substrate, wherein the driver layer comprises a buffer layer, a switch array layer, and an indium tin oxide (ITO) layer.

13. A flexible organic light emitting diode (OLED) device, comprising:
a flexible base;
a light emitting layer disposed on the flexible base; and
a barrier layer disposed on the light emitting layer, wherein the barrier layer is formed by evaporating a barrier material on a surface of the light emitting layer and irradiating a light beam on a surface of the barrier material during evaporating the barrier material; the barrier layer is configured to block water and oxygen; and wherein the barrier material comprises a precursor polymer, a photoinitiator, and a cross-linking agent.

14. The flexible OLED device according to claim 13, wherein a material of the precursor polymer comprises vinyl chloride, propylene, and styrene.

15. The flexible OLED device according to claim 13, wherein a material of the cross-linking agent comprises N,N'-methylene diacrylamide.

16. The flexible OLED device according to claim 13, wherein a material of the photoinitiator comprises 2-hydroxy-4'-(2-hydroxyethoxy)-2-methylpropiophenone and 2-butanone acid.

17. The flexible OLED device according to claim 13, wherein a ratio of an evaporation rate of the photoinitiator to an evaporation rate of the precursor polymer ranges from 1:8 to 1:25.

18. The flexible OLED device according to claim 13, wherein a ratio of an evaporation rate of the cross-linking agent to an evaporation rate of the precursor polymer ranges from 1:10 to 1:50.

19. The flexible OLED device according to claim 13, wherein the flexible base comprises a flexible substrate and a driver layer disposed on the flexible substrate, wherein the driver layer comprises a buffer layer, a switch array layer, and an indium tin oxide (ITO) layer.

* * * * *